United States Patent
Bujalski et al.

(10) Patent No.: US 9,354,518 B2
(45) Date of Patent: May 31, 2016

(54) EPOXY-FUNCTIONAL RADIATION-CURABLE COMPOSITION CONTAINING AN EPOXY-FUNCTIONAL SILOXANE OLIGOMER FOR ENHANCED FILM RETENTION AND ADHESION DURING SOLVENT DEVELOPMENT

(75) Inventors: Duane Raymond Bujalski, Auburn, MI (US); Jon Vierling Degroot, Jr., Midland, MI (US); David J. Deshazer, Bay City, MI (US); Shedric Oneal Glover, Midland, MI (US); Karen L. Hueston, Midland, MI (US); John Ladouce, Freeland, MI (US)

(73) Assignee: Dow Corning Corporation, Midland, MI (US)

( * ) Notice: Subject to any disclaimer, the term of this patent is extended or adjusted under 35 U.S.C. 154(b) by 85 days.

(21) Appl. No.: 14/119,950

(22) PCT Filed: May 23, 2012

(86) PCT No.: PCT/US2012/039112
§ 371 (c)(1),
(2), (4) Date: Feb. 5, 2014

(87) PCT Pub. No.: WO2012/162376
PCT Pub. Date: Nov. 29, 2012

(65) Prior Publication Data
US 2014/0154626 A1    Jun. 5, 2014

Related U.S. Application Data

(60) Provisional application No. 61/489,899, filed on May 25, 2011.

(51) Int. Cl.
*G03F 7/20* (2006.01)
*G03F 7/075* (2006.01)
(Continued)

(52) U.S. Cl.
CPC .............. *G03F 7/0757* (2013.01); *C08L 83/06* (2013.01); *C09D 183/06* (2013.01);
(Continued)

(58) Field of Classification Search
None
See application file for complete search history.

(56) References Cited

U.S. PATENT DOCUMENTS 6,832,036 B2  12/2004  Ghoshal et al.
6,856,745 B2   2/2005  Erben et al.
(Continued)

FOREIGN PATENT DOCUMENTS

CN    1890294 A    1/2007
JP    2004-102247 A    4/2004
(Continued)

OTHER PUBLICATIONS

"International Application Serial No. PCT/US2012/039112, International Preliminary Report on Patentability mailed May 13, 2012", 7 pgs.
(Continued)

*Primary Examiner* — Cynthia Hamilton
(74) *Attorney, Agent, or Firm* — Schwegman Lundberg & Woessner, P.A.

(57) ABSTRACT

The present invention provides a silicone composition that includes an epoxy-functional organopolysiloxane resin and an epoxy-functional organosiloxane oligomer, and a method of preparing optical waveguides using the silicon composition. The present invention also provides a cured silicon composition, and an optical waveguide that includes the cured silicon composition.

19 Claims, 1 Drawing Sheet

(51) Int. Cl.
*G02F 1/00* (2006.01)
*C08L 83/06* (2006.01)
*C09D 183/06* (2006.01)
*G02B 6/122* (2006.01)
*G03C 1/00* (2006.01)

(52) U.S. Cl.
CPC ........... *G02B 6/1221* (2013.01); *G02F 1/0063* (2013.01); *G03C 1/00* (2013.01); *G03F 7/20* (2013.01); *G02F 2202/023* (2013.01)

(56) References Cited

U.S. PATENT DOCUMENTS

| | | | |
|---|---|---|---|
| 6,905,904 | B2 | 6/2005 | Gardner et al. |
| 6,907,176 | B2 | 6/2005 | Gardner et al. |
| 7,005,231 | B2 | 2/2006 | Tamaki et al. |
| 7,031,591 | B2 | 4/2006 | Kodama et al. |
| 7,072,563 | B2 | 7/2006 | Shelnut et al. |
| 7,072,564 | B2 | 7/2006 | Shelnut et al. |
| 7,072,565 | B2 | 7/2006 | Shelnut et al. |
| 7,283,715 | B2 | 10/2007 | Kodama et al. |
| 7,771,794 | B2 | 8/2010 | Watanabe et al. |
| 7,863,399 | B2 | 1/2011 | Morita et al. |
| 8,133,957 | B2 | 3/2012 | Hamamoto et al. |
| 8,175,439 | B2 | 5/2012 | Fujiue et al. |
| 2004/0076391 | A1 | 4/2004 | Ghoshal et al. |
| 2008/0032061 | A1 | 2/2008 | Watanabe et al. |
| 2008/0058441 | A1 * | 3/2008 | Watanabe et al. ............. 522/170 |
| 2008/0260337 | A1 | 10/2008 | Bahadur et al. |
| 2009/0052856 | A1 | 2/2009 | Bae et al. |
| 2009/0182172 | A1 | 7/2009 | Kolb et al. |

FOREIGN PATENT DOCUMENTS

| | | |
|---|---|---|
| JP | 2004155954 | 6/2004 |
| JP | 2005-216352 A | 8/2005 |
| JP | 2005331607 | 12/2005 |
| JP | 2006106449 | 4/2006 |
| JP | 2007009086 | 1/2007 |
| JP | 2007-217704 A | 8/2007 |
| JP | 2007-238868 A | 9/2007 |
| JP | 2010-31149 A | 2/2010 |
| JP | 2012-237778 A | 12/2012 |
| JP | 2012-255125 A | 12/2012 |
| WO | WO-99/26112 A1 | 5/1999 |
| WO | WO-2005/056640 A1 | 6/2005 |
| WO | WO-2005/063843 A1 | 7/2005 |
| WO | WO-2005/116113 A1 | 12/2005 |
| WO | WO-2009/073404 A1 | 6/2009 |
| WO | WO-2011/084250 A2 * | 7/2011 |
| WO | WO-2012/162376 A1 | 11/2012 |

OTHER PUBLICATIONS

"Chinese Application Serial No. 201280029754.9, Office Action mailed Apr. 23, 2015", (w/ English Translation), 12 pgs.

"European Application Serial No. 12727465.2, Office Action mailed Feb. 4, 2014", 2 pgs.

"European Application Serial No. 12727465.2, Response filed Jul. 24, 2014 to Office Action mailed Feb. 4, 2014", 68 pgs.

"International Application Serial No. PCT/US2012/039112, Search Report mailed Sep. 4, 2012", 3 pgs.

"International Application Serial No. PCT/US2012/039112, Written Opinion mailed Sep. 4, 2012", 5 pgs.

Jeong, Sunho, et al., "Fabrication of Patterned Inorganic—Organic Hybrid Film for the Optical Waveguide by Microfluidic Lithography", Journal of the American Ceramic Society, 8(4), (Apr. 2005), 1033-1036.

Ponoth, S., et al., "Siloxane-based polymer epoxies for optical waveguides", Proc. SPIE, vol. 5260, (2003), 331-225.

"Japanese Application Serial No. 2014-512073, Office Action mailed Dec. 22, 2015", (w/ English Translation), 9 pgs.

* cited by examiner

EPOXY-FUNCTIONAL RADIATION-CURABLE COMPOSITION CONTAINING AN EPOXY-FUNCTIONAL SILOXANE OLIGOMER FOR ENHANCED FILM RETENTION AND ADHESION DURING SOLVENT DEVELOPMENT

CLAIM OF PRIORITY

This application is a national stage application under 35 U.S.C. §371 of PCT/US2012/039112, filed May 23, 2012, and published as WO 2012/162376 on Nov. 29, 2012, which claims the benefit of priority of U.S. Application Ser. No. 61/489,899, filed May 25, 2011, entitled "EPOXY-FUNCTIONAL RADIATION-CURABLE COMPOSITION CONTAINING AN EPOXY-FUNCTIONAL SILOXANE OLIGOMER FOR ENHANCED FILM RETENTION AND ADHESION DURING SOLVENT DEVELOPMENT," which application is herein incorporated by reference in its entirety.

BACKGROUND OF THE INVENTION

The controlled transmission of light is important in many areas of technology. Optical waveguides are an example of an apparatus useful for the controlled transmission of light over a variety of distances with minimal signal degradation. Quartz and glass are traditional materials used to fabricate reliable light-transmitting materials required for optical communication. However, fabrication using these inorganic materials involves the use of inconvenient and often inefficient high-temperature processes. Silicone compositions can be advantageous alternatives for the manufacturing of light-transmitting materials.

SUMMARY OF THE INVENTION

The present invention provides a silicone composition, and a method of preparing optical waveguides using the silicone composition. The present invention also provides a cured silicone composition, and an optical waveguide that includes the cured silicone composition.

In various embodiments, the silicone composition of the present invention when cured can provide a silicone core for an optical waveguide that exhibits unexpectedly increased flexibility or reduced cracking. In some examples, the increased flexibility or reduced cracking of the cured composition can occur with increased loading of the silicone composition with the organosiloxane oligomer. For example, various embodiments can possess sufficient elasticity and hardness such that substantially no warping or cracking is experienced. In some examples, the cured composition has increased adhesion to clad or substrate layers of the waveguide. Some embodiments of the composition of the present invention can provide high resolution, providing excellent retention of critical dimensions when cured, as evidenced by high film retention following development with an organic solvent. Correspondingly, some examples of the method of the present invention can transfer images and patterns from a photomask to a silicone film on a substrate with excellent retention of critical dimensions, such as height, which can result in more tailored dimensions, for example, of a waveguide. Some examples of the optical waveguide assemblies can exhibit good thermal stability over a wide range of temperatures and good environmental resistance, such as moisture resistance, comparable to or better than waveguide assemblies using other known materials. Also, some examples of the waveguide assemblies exhibit low birefringence and low transmission loss, and high transmittance in the communication wavelength band, that can be equal to or better than the corresponding characteristics of waveguides using other known materials. Thus, in some examples superior flexibility and resistance to cracking are not acquired at the expense of transmission loss. In some embodiments, controlling the index of refraction can be easier in comparison with conventional compositions, and changes in optical transmittance and index of refraction can be very small even exposed to elevated temperatures. In some examples the silicone composition of the present invention can quickly cure upon irradiation with active energy rays, such as UV rays, can have superior shape-retaining properties even in thin film form, and can contain no air bubbles in its cured product, with the cured product possessing resistance to hydrolysis and solvent resistance. In some examples, optical transmission components made of the cured silicone composition of the present invention have superior shape-retaining properties even in thin film form.

In various embodiments, the present invention provides a silicone composition. The silicone composition includes (A) an epoxy-functional organopolysiloxane resin. The epoxy-functional organopolysiloxane resin has the average unit formula:

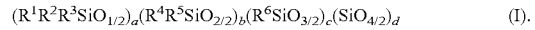

$$(R^1R^2R^3SiO_{1/2})_a(R^4R^5SiO_{2/2})_b(R^6SiO_{3/2})_c(SiO_{4/2})_d \quad (I).$$

In formula (I), $R^1$, $R^2$, $R^3$, $R^4$, $R^5$, and $R^6$ are organic groups independently selected from $C_{1-6}$ monovalent aliphatic hydrocarbon groups, $C_{6-10}$ monovalent aromatic hydrocarbon groups, and monovalent epoxy-substituted organic groups. In formula (I), the following conditions are satisfied: $0 \le a < 0.4$, $0 < b < 0.5$, $0 < c < 1$, $0 \le d < 0.4$, $0.1 \le b/c \le 0.3$, and $a+b+c+d=1$. The epoxy-functional organopolysiloxane resin has a number-average molecular weight of at least about 2000. In the resin, at least about 15 mol % of the organic groups are $C_6$ to $C_{10}$ monovalent aromatic hydrocarbon groups. Also, about 2 to about 50 mol % of siloxane units have epoxy-substituted organic groups. The silicone composition also includes (B) an epoxy-functional organosiloxane oligomer. The epoxy-functional organosiloxane oligomer has an average of at least two epoxy-substituted organic groups per molecule. Additionally, the oligomer has a molecular weight not greater than about 1500. The silicone composition also includes (C) a cationic photoinitiator. Additionally, the silicone composition includes (D) an optional organic solvent. In some embodiments, component (D) is present; in other embodiments, component (D) is not present.

In various embodiments, the present invention provides a method of preparing a flexible planar optical waveguide assembly. The method includes step (i), applying a silicone composition to a surface of a substrate. Applying the silicone composition to a surface of a substrate forms a first silicone film. The silicone composition includes the silicone composition provided by the present invention as described herein. The method also includes step (ii), exposing at least one selected region of the first silicone film to radiation. The radiation has a wavelength of from about 150 to about 800 nm. The exposure to the radiation produces a partially exposed film having at least one exposed region and at least one non-exposed region. The method also includes step (iii), removing the non-exposed region of the partially exposed film. The non-exposed region of the partially exposed film is removed with a developing solvent. Removing the non-exposed region of the partially exposed film forms a patterned film. The method also includes step (iv), heating the patterned film. The patterned film is heated for an amount of time sufficient to form at least one silicone core having a refractive index of from about 1.45 to about 1.60 at about 23° C. for light having a wavelength of about 589 nm. The substrate has a refractive index less than the refractive index of the silicone core. The method also includes (v) optionally covering the substrate and the silicone core with a second silicone composition to form a second silicone film. The method also includes (vi) optionally curing the second silicone film to form a clad layer, wherein the clad layer has a refractive index less than the refractive index of the silicone core.

In various embodiments, the present invention provides a method of preparing a flexible planar optical waveguide assembly. The method includes step (i), applying a first silicone composition to a surface of a substrate. Applying the first silicone composition to the surface of the substrate forms a first silicone film. The method also includes step (ii), curing the first silicone film. Curing the first silicone film forms a lower clad layer. The method also includes step (iii), applying a second silicone composition to the lower clad layer. Applying the second silicone composition to the lower clad layer forms a second silicone film. The method also includes step (iv), exposing at least one selected region of the second silicone film to radiation. The radiation has a wavelength of from about 150 to about 800 nm. Exposing the at least one selected region of the second silicone film to radiation produces a partially exposed film having at least one exposed region and at least one non-exposed region. The method also includes step (v), removing the non-exposed region of the partially exposed film with a developing solvent. Removing the non-exposed region of the partially exposed film forms a patterned film. The method also includes step (vi), heating the patterned film for an amount of time. The amount of time the patterned film is heated is sufficient to form at least one silicone core having a refractive index of from about 1.45 to about 1.60 at about 23° C. for light having a wavelength of 589 nm. The lower clad layer has a refractive index less than the refractive index of the silicone core. The method also includes step (vii), optionally covering the lower clad layer and the silicone core with a third silicone composition to form a third silicone film. The method also includes step (viii), optionally curing the third silicone film to form an upper clad layer, wherein the upper clad layer has a refractive index less than the refractive index of the silicone core. At least one of the first silicone composition and the second silicone composition includes the silicone composition provided by the present invention as described herein. The optional third silicone composition optionally includes the silicone composition provided by the present invention as described herein.

BRIEF DESCRIPTION OF THE FIGURES

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

DETAILED DESCRIPTION OF THE INVENTION

Figure 1:
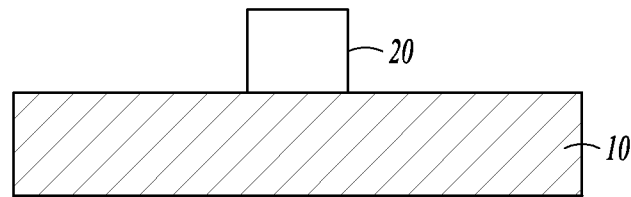
FIG. 1 illustrates a cross-sectional view of an embodiment of an optical waveguide assembly of the present invention, prepared according to methods described herein.

Reference will now be made in detail to certain claims of the disclosed subject matter, examples of which are illustrated in the accompanying drawings. While the disclosed subject matter will be described in conjunction with the enumerated claims, it will be understood that they are not intended to limit the disclosed subject matter to those claims. On the contrary, the disclosed subject matter is intended to cover all alternatives, modifications, and equivalents, which can be included within the scope of the presently disclosed subject matter as defined by the claims.

References in the specification to "one embodiment," "an embodiment," "an example embodiment," and the like, indicate that the embodiment described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art to effect such feature, structure, or characteristic in connection with other embodiments whether or not explicitly described.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a concentration range of "about 0.1% to about 5%" should be interpreted to include not only the explicitly recited concentration of about 0.1 wt % to about 5 wt %, but also the individual concentrations (e.g., 1%, 2%, 3%, and 4%) and the sub-ranges (e.g., 0.1% to 0.5%, 1.1% to 2.2%, 3.3% to 4.4%) within the indicated range.

In this document, the terms "a," "an," or "the" are used to include one or more than one unless the context clearly dictates otherwise. The term "or" is used to refer to a nonexclusive "or" unless otherwise indicated. The term "about" as used herein can allow for a degree of variability in a value or range, for example, within 10%, within 5%, or within 1% of a stated value or of a stated limit of a range. When a range or a list of sequential values is given, unless otherwise specified any value within the range or any value between the given sequential values is also disclosed. The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more. In addition, it is to be understood that the phraseology or terminology employed herein, and not otherwise defined, is for the purpose of description only and not of limitation. Any use of section headings is intended to aid reading of the document and is not to be interpreted as limiting; information that is relevant to a section heading may occur within or outside of that particular section. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference should be considered supplementary to that of this document; for irreconcilable inconsistencies, the usage in this document controls.

In the methods of manufacturing described herein, the steps can be carried out in any order without departing from the principles of the invention, except when a temporal or operational sequence is explicitly recited. Furthermore, specified steps can be carried out concurrently unless explicit claim language recites that they be carried out separately. For example, a claimed step of doing X and a claimed step of doing Y can be conducted simultaneously within a single operation, and the resulting process will fall within the literal scope of the claimed process.

The terms "epoxy-functional" or "epoxy-substituted" as used herein refers to a functional group in which an oxygen atom, the epoxy substituent, is directly attached to two adjacent carbon atoms of a carbon chain or ring system. Examples of epoxy-substituted functional groups include, but are not limited to, 2,3-epoxypropyl, 3,4-epoxybutyl, 4,5-epoxypentyl, 2-glycidoxyethyl, 3-glycidoxypropyl, 4-glycidoxybutyl, 2-(3,4-epoxycylohexyl)ethyl, 3-(3,4-epoxycylohexyl)propyl, 2-(3,4-epoxy-3-methylcylohexyl)-2-methylethyl, 2-(2,3-epoxycylopentyl)ethyl, and 3-(2,3-epoxycylopentyl)propyl.

The term "oligomer" as used herein refers to a molecule having an intermediate relative molecular mass, the structure of which essentially includes a small plurality of units derived, actually or conceptually, from molecules of lower relative molecular mass. A molecule having an intermediate relative mass can be a molecule that has properties that vary with the removal of one or a few of the units. The variation in the properties that results from the removal of the one of more units can be a significant variation.

The term "resin" as used herein refers to polysiloxane material of any viscosity that includes at least one siloxane monomer that is bonded via a Si—O—Si bond to three or four other siloxane monomers. In one example, the polysiloxane material includes T or Q groups, as defined herein.

The term "optical waveguide" as used herein refers to a physical structure that guides electromagnetic waves in the optical spectrum.

The term "radiation" as used herein refers to energetic particles travelling through a medium or space. Examples of radiation are visible light, infrared light, microwaves, radio waves, very low frequency waves, extremely low frequency waves, thermal radiation (heat), and black-body radiation.

The term "cure" as used herein refers to exposing to radiation in any form, heating, or allowing to undergo a physical or chemical reaction that results in hardening or an increase in viscosity.

The term "film" as used herein refers to a coating of any shape.

The term "refractive index" as used herein refers to a measure of the speed of light in a substance, and is equal to the velocity of light in a vacuum divided by the velocity of light in the substance.

Epoxy-Functional Organopolysiloxane Resin, Component (A)

The epoxy-functional organopolysiloxane resin, Component (A), is an ingredient of the silicone composition of the present invention. It can be the main ingredient of the composition provided by the present invention. The epoxy-functional organopolysiloxane resin represented by the average siloxane unit formula:

$$(R^1R^2R^3SiO_{1/2})_a(R^4R^5SiO_{2/2})_b(R^6SiO_{3/2})_c(SiO_{4/2})_d \quad (I)$$

wherein $R^1$, $R^2$, $R^3$, $R^4$, $R^5$, and $R^6$ are organic groups independently selected from $C_{1-6}$ monovalent aliphatic hydrocarbon groups, $C_{6-10}$ monovalent aromatic hydrocarbon groups, and monovalent epoxy-substituted organic groups, $0 \leq a < 0.4$, $0 < b < 0.5$, $0 < c < 1$, $0 \leq d < 0.4$, $0.1 \leq b/c \leq 0.3$, $a+b+c+d=1$, the resin has a number-average molecular weight of at least about 2000, at least about 15 mol % of the organic groups are $C_6$ to $C_{10}$ monovalent aromatic hydrocarbon groups, and about 2 to about 50 mol % of siloxane units per molecule have epoxy-substituted organic groups. Due to the epoxy groups it contains, the resin can quickly cure upon irradiation with active energy rays, such as UV rays, electron beams, or ionizing radiation, in the presence of (C) a cationic photoinitiator. Optionally, a photosensitizer can also be present in the composition. When the composition is in contact with a substrate (for example, a silicon substrate), irradiating it with active energy rays, such as UV rays, electron beams or ionizing radiation, causes the composition to cure. The cured composition can be firmly adhered to the substrate.

In the epoxy-functional organopolysiloxane resin (A) represented by the average siloxane unit formula (I), the $(R^4R^5SiO_{2/2})$ units and $(R^6SiO_{3/2})$ units are present, whereas the $(R_1R_2R_3SiO_{1/2})$ and $(SiO_{4/2})$ units are optional constituent units. Thus, there can be epoxy-functional organopolysiloxane resins including the following units:

$$(R^4R^5SiO_{2/2})_b(R^6SiO_{3/2})_c;$$

$$(R^1R^2R^3SiO_{1/2})_a(R^4R^5SiO_{2/2})_b(R^6SiO_{3/2})_c;$$

$$(R^4R^5SiO_{2/2})_b(R^6SiO_{3/2})_c(SiO_{4/2})_d; \text{ or}$$

$$(R^1R^2R^3SiO_{1/2})_a(R^4R^5SiO_{2/2})_b(R^6SiO_{3/2})_c(SiO_{4/2})_d.$$

In descriptions of average unit formula, such as formula I, the subscripts a, b, c, and d are mole fractions. The subscript a is $0 \leq a < 0.4$ because the molecular weight of the epoxy-containing organopolysiloxane resin (A) drops when there are too many $(R^1R^2R^3SiO_{1/2})$ units, and, when $(SiO_{4/2})$ units are introduced, the hardness of the cured product of the epoxy-functional organopolysiloxane resin (A) is markedly increased and the product can be easily rendered brittle. For this reason, the subscript d is $0 \leq d < 0.4$, $0 \leq d < 0.2$, or d=0. In addition, the molar ratio b/c of the $(R^4R^5SiO_{2/2})$ units and $(R^6SiO_{3/2})$ units can be not less than about 0.01 and not more than about 0.3. In some examples, deviation from this range in the manufacture of the epoxy-functional organopolysiloxane resin (A) can result in generation of insoluble side products, in making the product more prone to cracking due to decreased toughness, or in a decrease in the strength and elasticity of the product and making it more prone to scratching. In some examples, the range molar ratio b/c is not less than about 0.01 and not more than about 0.25, or not less than about 0.02 and not more than about 0.25. The epoxy-functional organopolysiloxane resin (A) contains the $(R^4R^5SiO_{2/2})$ units and $(R^6SiO_{3/2})$ units, and its molecular structure is in most cases a network structure or a three-dimensional structure because the molar ratio of b/c is not less than about 0.01 and not more than about 0.3.

The silicon-bonded $C_{1-6}$ monovalent aliphatic hydrocarbon groups in component (A) are exemplified by methyl, ethyl, propyl, butyl, hexyl, and other monovalent saturated aliphatic hydrocarbon groups, and by vinyl, allyl, hexenyl, and other monovalent unsaturated aliphatic hydrocarbon groups. In addition, the silicon-bonded $C_{6-10}$ monovalent aromatic hydrocarbon groups are exemplified by phenyl, tolyl, xylyl, and naphthyl.

The index of refraction of the cured composition, which is an optical characteristic, can be regulated by changing the type of the monovalent hydrocarbon groups. When methyl and other monovalent aliphatic hydrocarbon groups are used as the primary substituent groups, the index of refraction tends to be less than about 1.5, whereas using phenyl and other monovalent aromatic hydrocarbon groups as the primary substituent groups tends to result in an index of refraction of about 1.5 or more. In some examples, the monovalent saturated aliphatic hydrocarbon groups can be methyl groups, and the monovalent aromatic hydrocarbon groups can be phenyl groups. In some examples, vinyl groups can be used when the composition contains monovalent unsaturated aliphatic hydrocarbon groups.

In various examples, the monovalent aromatic hydrocarbon groups constitute not less than about 15 mol %, not less than about 20 mol %, or not less than about 25 mol % of all the organic groups in component (A). If the content of the monovalent aromatic hydrocarbon groups is too low, the optical transmittance of the cured product of the silicone composition of the present invention in the communication wavelength band can decrease, and also the cured product can becomes prone to cracking as a result of a decrease in toughness.

In component (A), siloxane units having epoxy-functional monovalent hydrocarbon groups constitute about 2 mol % to about 50 mol %, about 10 mol % to about 40 mol %, or about 15 mol % to about 40 mol % of all the siloxane units. If there is less than 2 mol % of such siloxane units, the density of cross-linking during curing can be low, which can make it difficult to obtain hardness that is sufficient for an optical transmission component. On the other hand, an amount exceeding 50 mol % can be unsuitable because it can bring about a decrease in the optical transmittance and heat resistance of the cured product. In the epoxy-functional monovalent hydrocarbon groups, the epoxy groups can be bonded to silicon atoms through alkylene groups, such that these epoxy groups are not directly bonded to the silicon atoms. The epoxy-functional organopolysiloxane resin (A) can be produced by well-known conventional manufacturing methods, such as, for example, the methods disclosed in JP6298940.

While there are no particular limitations concerning the number-average molecular weight of the epoxy-functional organopolysiloxane resin (A), if the toughness of the cured product and its solubility in organic solvents are taken into consideration, in some embodiments the molecular weight is not less than about 10 and not more than about $10^6$. In one embodiment, the resin (A) includes a combination of two or more kinds of such epoxy-functional organopolysiloxane resins with different content and type of the epoxy-containing organic groups and monovalent hydrocarbon groups or with different molecular weights.

Epoxy-Functional Organosiloxane Oligomer, Component (B)

The composition of the present invention includes an epoxy-functional organosiloxane oligomer, Component (B). A variety of organosiloxane oligomers have been found useful in the present composition and method. In one embodiment, Component (B) is an epoxy-functional organosiloxane oligomer having an average of at least two epoxy-substituted organic groups per molecule and a molecular weight not greater than about 1500. The epoxy-functional organosiloxane oligomer can have the formula:

$$R^8R^7_2SiO(R^7_2SiO)_mSiR^7_2R^8 \qquad (II)$$

wherein $R^7$ is $C_{1-8}$ alkyl, $R^8$ is an epoxy-substituted organic group, and m is 0 or a positive integer. In some embodiments an epoxy group in the organosiloxane oligomer is a cycloalkene oxide group, especially a cyclohexene oxide group, since the reagents that can be used to prepare this type of grouping are readily available commercially and are inexpensive. In some embodiments the organosiloxane oligomer has two cyclohexene oxide groupings are linked to an Si—O—Si grouping. Examples of such oligomers include those having formula (II) wherein m is 0 and $R^8$ is 3,4-epoxycylcohexyl-ethyl, corresponding to the formula:

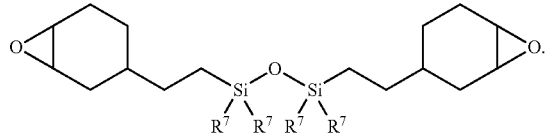

The compound in which each group $R^7$ is a methyl group is available from Polyset Corporation, Inc., under the tradename PC-1000, and the preparation of this specific compound is described in, inter alia, U.S. Pat. Nos. 5,387,698 and 5,442,026.

In some examples, the epoxy-functional organosiloxane oligomer can have the formula:

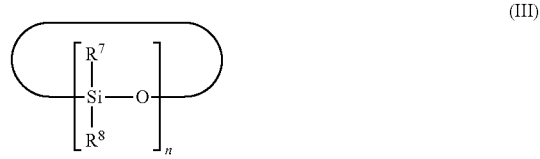

(III)

wherein $R^7$ is $C_{1-8}$ alkyl, $R^8$ is an epoxy-substituted organic group, $R^9$ is $R^7$ or —OSiR$^7_2$R$^8$, m is 0 or a positive integer, and n is from 3 to 10. In another embodiment, each group $R^7$ is, independently, a monovalent substituted or unsubstituted $C_{1-12}$ alkyl. $C_{1-12}$ cycloalkyl, aralkyl or aryl group; each group $R^8$ is, independently, $R^7$ or a monovalent epoxy functional group having 2-10 carbon atoms, with the proviso that at least two of the groups $R^8$ are epoxy functional; and n is from 3-10. The preparation of these cyclic compounds is described in, inter alia, U.S. Pat. Nos. 5,037,861; 5,260,399; 5,387,698; and 5,583,194. One example of this type of compound is 1,3,5,7-tetrakis(2-(3,4-epoxycyclohexyl)ethyl)-1,3,5,7-tetramethylcyclotetrasiloxane.

In some examples, the epoxy-functional organosiloxane oligomer can have the formula:

$$R^9Si(OSiR^7_2R^8)_3 \qquad (IV)$$

wherein $R^7$ is $C_{1-8}$ alkyl, $R^8$ is an epoxy-substituted organic group, $R^9$ is $R^7$ or —OSiR$^7_2$R$^8$, m is 0 or a positive integer, and n is from 3 to 10. In one embodiment, $R^9$ is an OSi(R$^7$)$_2$R$^8$ grouping, or a monovalent substituted or unsubstituted $C_{1-12}$ alkyl, $C_{1-12}$ cycloalkyl, aralkyl or aryl group; each group $R^7$ is, independently, a monovalent substituted or unsubstituted $C_{1-12}$ alkyl, $C_{1-12}$ cycloalkyl, aralkyl or aryl group; and each group $R^8$ is, independently, a monovalent epoxy functional group having 2-10 carbon atoms; this type of oligomer can be called a "star type" oligomer. The preparation of these oligomers is described in, inter alia, U.S. Pat. Nos. 5,169,962; 5,260,399; 5,387,698; and 5,442,026. In an example, $R^9$ is a methyl group or an OSi(R$^7$)$_2$R$^8$ grouping; each group $R^7$ is a methyl group, and each group $R^8$ is a 2-(3,4-epoxycyclohexyl)ethyl grouping.

In some examples, the epoxy-functional oligomer can have the average unit formula:

$$(R^{B6})_3SiO[SiR^{B7}R^{B7}R^{B8}O]_p[Si(R^{B7})_2O]_qSi(R^{B6})_3 \qquad (V)$$

wherein each group $R^{B6}$ is, independently, a monovalent substituted or unsubstituted $C_{1-12}$ alkyl, $C_{1-12}$ cycloalkyl, or phenyl group; each group $R^{B7}$ is, independently, a monovalent substituted or unsubstituted $C_{1-12}$ alkyl, $C_{1-12}$ cycloalkyl, aralkyl, or aryl group; each group $R^{B8}$ is, independently, a monovalent epoxy functional group having 2-10 carbon atoms, and p and q are integers. These oligomers can be prepared by processes analogous to those described in U.S. Pat. No. 5,523,374, which involve hydrosilylation of the corresponding hydrosilanes with the appropriate alkene oxide using a platinum or rhodium catalyst. Specific oligomers of this type can be those in which each group $R^{B6}$ and $R^{B7}$ is an alkyl group. In one example, $R^{B8}$ is an 2-(3,4-epoxycyclohexyl)ethyl grouping and p and q are approximately equal.

Cationic Photoinitiator, Component (C)

The cationic photoinitiator (C) is used as a photoinitiator for epoxy-functional organopolysiloxanes. Any cationic photoinitiator that is known by one of skill in the art can be used, such as sulfonium salts, iodonium salts, selenonium salts, phosphonium salts, diazonium salts, paratoluene sulfonates, trichloromethyl-substituted triazines, and trichloromethyl-substituted benzenes. Examples of sulfonium salts can include salts represented by the formula $R^c_3S^+X^-$. In the formula, $R^c$ can stand for methyl, ethyl, propyl, butyl, and other $C_{1-6}$ alkyl groups; phenyl, naphthyl, biphenyl, tolyl, propylphenyl, decylphenyl, dodecylphenyl, and other $C_{1-24}$ aryl group or substituted aryl groups, and $X^-$ in the formula can represent $SbF_6^-$, $AsF_6^-$, $PF_6^-$, $BF_4^-$, $B(C_6F_5)_4^-$, $HSO_4^-$, $ClO_4^-$, $CF_3SO_3^-$ and other non-nucleophilic non-basic anions. Examples of iodonium salts can include salts represented by the formula $R^c_2I^+X^-$; examples of selenonium salts can include salts represented by the formula $R^c_3Se^+X^-$; examples of phosphonium salts can include salts represented by the formula $R^c_4P^+X^-$; examples of diazonium salts can include salts represented by the formula $R^cN_2^+X^-$; with the $R^c$ and $X^-$ in the formulas being the same as described herein for $R^c_3S^+X^-$. Examples of paratoluene sulfonates can include compounds represented by the formula $CH_3C_6H_4SO_3R^{c1}$, with the $R^{c1}$ in the formula standing for organic groups including electron-attracting groups, such as benzoylphenylmethyl groups, phthalimide groups, and the like. Examples of trichloromethyl-substituted triazines can include compounds represented by $[CCl_3]_2C_3N_3R^{c2}$, with the $R^{c2}$ in the formula standing for phenyl, substituted or unsubstituted phenylethyl, substituted or unsubstituted furanylethynyl, and other electron-attracting groups. Examples of trichloromethyl-substituted benzenes can include compounds represented by $CCl_3C_6H_3R^cR^{c3}$, with the $R^c$ in the formula being the same as described herein for $R^c_3S^+X^-$ and the $R^{c3}$ standing for halogen groups, halogen-substituted alkyl groups, and other halogen-containing groups.

Examples of the photoinitiator can include, for example, triphenylsulfonium tetrafluoroborate, di(p-tertiary butylphenyl) iodonium hexafluoroantimonate, bis(dodecylphenyl)iodonium hexafluoroantimonate, and p-chlorophenyldiazonium tetrafluoroborate.

While commonly known carbonyl-containing aromatic compounds can be used as the optional photosensitizer, there are no particular limitations concerning these compounds so long as they produce photosensitizing effects. Examples of photosensitizers can include, for example, isopropyl-9H-thioxanthene-9-one, anthrone, 1-hydroxycyclohexyl-phenylketone, and 2-hydroxy-2-methyl-1-phenylpropan-1-one.

Organic Solvent, Component (D)

Although the organic solvent (D) is an optional component, it can be used, for example, if Component (A) or Component (B) is solid or in the form of a viscous liquid at the temperature at which molding is carried out, or when Component (A) or Component (B) is molded into a film. In addition, when the photoinitiator (B) is not soluble in Component (A) or Component (B), the solvent can be used to dissolve it. A solvent can be used that can dissolve Component (A), Component (B), and photoinitiator (C). The solvent can be used singly or as a mixture of two or more solvents. A solvent with a boiling point between about 80° C. to about 200° C. can be used. Examples of the solvent can include isopropyl alcohol, tertiary butyl alcohol, methylethylketone, methylisobutylketone, acetylacetone, anisole, toluene, xylene, mesitylene, chlorobenzene, ethylene glycol dimethyl ether, ethylene glycol diethyl ether, diethylene glycol dimethyl ether, ethoxy-2-propanol acetate, methoxy-2-propanol acetate, octamethylcyclotetrasiloxane, and hexamethyldisiloxane, or any combination thereof.

Composition, and Use Thereof for Light-Transmitting Components

The present invention provides a silicone composition that includes Component (A), an epoxy-functional organopolysiloxane resin, Component (B), an epoxy-functional organosiloxane oligomer, Component (C), a cationic photoinitiator, and Component (D), an organic solvent. Generally, descriptions of chemical formulas herein refer to the uncured composition. However, the present invention also provides a cured silicone composition resulting from curing the uncured silicone composition of the present invention. As will be readily understood by one of ordinary skill in the art, due to chemical reactions that occur during curing, for example cross-linking, the molecules of the cured composition of the present invention can possess a different molecular formula than the molecules of the uncured composition of the present invention. Additionally, different types of curing, for example heating versus UV light treatment, can result in different changes to the molecular formula. Any cured composition that results from the curing the uncured composition of the present invention is encompassed within embodiments of the present invention.

The silicone composition of the present invention can include (A) about 100 parts by weight of the above-described epoxy-functional organopolysiloxane resin, (B) about 0.01 to about 100 parts by weight of an epoxy-functional organosiloxane oligomer, (C) about 0.05 to about 20 parts by weight of a photoinitiator, (D) about 0 to about 5,000 parts by weight of an organic solvent. It is optional to add Component (D) when Component (A) is liquid, or when the miscibility of Component (A) with Component (B) and Component (C) is good. When the amount of the Component (C) is less than about 0.05 parts by weight, curing can be insufficient, and amounts exceeding about 20 parts by weight can be unsuitable because of the deterioration of optical characteristics due to the presence of residual catalysts. In addition, adding Component (D) in an amount exceeding 5000 parts by weight can be unsuitable because it can become difficult to obtain high-quality thin films during the manufacture of optical transmission components, as described further below. Although the amount of the added Component (D) can vary depending on its type and the solubility and consistency of Component (C), Component (B), and Component (A), in some examples it can be about 1 to about 1000 parts by weight or about 1 to about 500 parts by weight. The amount of optional photosensitizer can be about 0.05 to about 20 parts per weight. In some examples, when the amount of optional photosensitizer is less than 0.01 parts by weight, curing can be insufficient and adhesion can be inferior. On the other hand, in some examples an amount exceeding 20 parts by weight can be unsuitable because of the deterioration of optical characteristics due to the presence of residual catalysts. In various embodiments, the total number of parts by weight of the silicone composition can include a minimum of about 100.06 parts by weight of Components (A), (B), (C), and (D), resulting from about 100 parts by weight of Component (A), about 0.01 parts by weight of Component (B), about 0.05 parts by weight of Component (C), and about 0 parts by weight of Component (D). The total number of parts by weight of the silicone composition can include a maximum of about 5220 parts by weight of Components (A), (B), (C), and (D), resulting from about 100 parts by weight of Component (A), about 100 parts by weight of Component (B), about 20 parts by weight of Component (C), and about 5000 parts by weight of Component (D).

In some embodiments, the silicone composition can include (A) about 100 parts by weight of the above-described epoxy-functional organopolysiloxane resin, (B) about 5 to about 40 parts by weight, or about 1 to about 80 parts by weight, or about 0.01 to about 100 parts by weight of an epoxy-functional organosiloxane oligomer, (C) about 5 to about 6 parts by weight, or about 3 to about 8 parts by weight, or about 1 to about 12 parts by weight, or about 0.05 to about 20 parts by weight of a photoinitiator, (D) about 140 to about 160 parts by weight, or about 100 to about 250 parts by weight, or about 50 to about 1000 parts by weight, or about 0 to about 5,000 parts by weight of an organic solvent.

When the silicone composition of the present invention is used to make cured films or optical transmission components, the composition can be liquid at room temperature and, and in some examples, can have a viscosity of about 20 to about 10.000 mPa·s at 25° C. In some examples, deviation from this range can bring about a decrease in processability and can make obtaining thin films with high optical quality more difficult.

The silicone composition of the present invention can also include additional ingredients, provided the additional ingredient does not adversely affect the photopatterning or cure of the composition in the methods described herein. Examples of additional ingredients include, but are not limited to, adhesion promoters, solvents, inorganic fillers, photosensitizers, and surfactants.

In some embodiments, the index of refraction of the cured silicone composition of the present invention can be precisely adjusted by modifying the molar ratio of the silicon-bonded groups. e.g. monovalent aliphatic hydrocarbon groups (e.g. methyl groups) and monovalent aromatic hydrocarbon groups (e.g. phenyl groups), in the epoxy-functional organopolysiloxane resin (A). Increasing the proportion of the monovalent aromatic hydrocarbon groups can make the index of refraction higher, and when the number of monovalent aliphatic hydrocarbon groups is increased, the index of refraction can become lower. When optical waveguides are fabricated from the silicone composition of the present invention, the index of refraction of the cured organopolysiloxane resin used for the core can be higher than that of the cured organopolysiloxane resin used for the cladding, thus the amount of monovalent aromatic hydrocarbon groups in the organopolysiloxane resin composition used for the core can be made higher than that of the organopolysiloxane resin composition used for the cladding. Two kinds of organopolysiloxane resin containing different molar ratios of monovalent aliphatic hydrocarbon groups to monovalent aromatic hydrocarbon groups can be used separately for the core and for the cladding, or the two kinds of organopolysiloxane resin can be mixed in different proportions. For example, in some embodiments, component (B) can be used in different proportions in the core, the cladding, or in any other part of an optical waveguide.

In some examples, the optical transmission component of the present invention can be used both for passive components and active components. Example of the passive transmission components can include by non-branched optical waveguides, branched optical waveguides, multiplexer/demultiplexers, optical adhesives, and the like. Examples of the active transmission components can include waveguide-type optical switches, waveguide-type optical modulators, optical attenuators, optical amplifiers, and the like.

Method of Preparing a Waveguide Assembly

The present invention provides method of preparing an optical transmission component such as an optical waveguide assembly. The present invention also provides optical waveguide assemblies that including cured compositions of the present invention.

In one embodiment an optical transmission component of high transmittance in a designated wavelength region can be produced by 1) applying the silicone composition to a substrate, 2) irradiating the silicone composition with active energy rays, such as UV rays, and, optionally or necessarily, subjecting it to heating. In addition, an optical transmission component, such as an optical waveguide, can be produced by repeating step 1) and step 2).

Example embodiments of methods of preparing optical waveguide assemblies according to the present invention can include the following. First, a silicone composition used for the cladding can be spin-coated on a substrate and the coating is cured by irradiation with active energy rays, thereby forming a bottom cladding layer. Next, a silicone composition used for the core can be spin-coated on the bottom cladding layer and the resultant coating can be cured by irradiation with active energy rays to form a core layer which, upon shaping as necessary, can be used as a core layer possessing a higher index of refraction than the cladding layer. In order to impart the desired shape to the core layer, e.g. to pattern it, the core layer can be irradiated with active energy rays through a photo-mask having an outline of the shape, and, if necessary, subjected to the herein-described heating, whereupon unexposed portions can be dissolved and removed using an organic solvent. The organic solvent (D) can be used as the organic solvent used for this purpose. An optical waveguide including a cladding layer, a core layer, and another cladding layer can be obtained when a silicone composition used for the cladding is applied on top of the core layer, in other words, on top of the patterned core layer and the bottom cladding layer. The top cladding layer can be formed via curing by irradiation with active energy rays. In the above-mentioned manufacturing method, the cured silicone composition used for the core has a higher index of refraction than the cured silicone composition used for the cladding. The solvent-casting technique can be used instead of spin coating during the application of the silicone composition.

In one embodiment, one or more of the obtained coatings can be peeled off to form a film-type optical waveguide. In one example, one or more of the coatings are peeled off from the substrate. In one example, the lower cladding layer can be peeled off from the substrate. A new core layer can be formed on the separated cladding layer and then coated with an upper cladding layer, whereby another film-type optical waveguide can be formed. The cured bodies of the silicone composition intended for cores should have refractive indices greater than those of the cured bodies produced from the silicone composition for claddings. A solvent-cast method can be used instead of spinning for application of the compositions.

In one embodiment of the present invention, a first method of preparing a flexible planar optical waveguide assembly includes: (i) applying a silicone composition to a surface of a substrate to form a first silicone film, wherein the silicone composition includes an embodiment of the silicon composition of the present invention; (ii) exposing at least one selected region of the first silicone film to radiation having a wavelength of from about 150 to about 800 nm to produce a partially exposed film having at least one exposed region and at least one non-exposed region; (iii) removing the non-exposed region of the partially exposed film with a developing solvent to form a patterned film; and (iv) heating the patterned film for an amount of time sufficient to form at least one silicone core having a refractive index of from about 1.45 to about 1.60 at about 23° C. for light having a wavelength of about 589 nm; wherein the substrate has a refractive index less than the refractive index of the silicone core.

In one embodiment the substrate can be a rigid or flexible material. Examples of substrates include, but are not limited to, a semiconductor material such as silicon, silicon having a surface layer of silicon dioxide, and gallium arsenide; quartz; fused quartz; aluminum oxide; polyolefins such as polyethylene and polypropylene; fluorocarbon polymers such as polytetrafluoroethylene and polyvinylfluoride; polystyrene; polyamides such as nylon; polyimides; polyesters and acrylic polymers such as poly(methyl methacrylate); epoxy resins; polycarbonates; polysulfones; polyether sulfones; ceramics; and glass.

In the methods of the present invention, for example, one or more of the silicone compositions or curable polymer compositions can be applied to the substrate or to another cured layer such as a clad or core layer using any conventional method, such as spin coating, dipping, spraying, brushing, or screen printing. One or more of the silicone compositions or curable polymer compositions can be applied by spin coating at a speed of from 200 rpm to 5000 rpm for 5 seconds to 60 seconds. The spin speed, spin time, and viscosity of the silicone compositions or curable polymer compositions can be adjusted so that the first silicone film has the desired thickness. When the curable polymer composition includes a solvent, the methods can further include removing at least a portion of the solvent from the film. The solvent can be removed by heating the first polymer film at a temperature of from about 50° C. to about 150° C. for about 1 min to about 5 min, alternatively from about 80° C. to about 120° C. for about 2 min to about 4 min. The curable composition can be cured by a variety of means, depending on cure mechanism of the particular composition, including exposure to ambient or elevated temperature, irradiation, and exposure to moisture.

The cure mechanism of the compositions is not limited. The compositions can be cured, for example, by a condensation or addition reaction. Examples of curable polymer compositions include, but are not limited to, curable silicone compositions, such as hydrosilylation-curable silicone compositions, condensation-curable silicone compositions, and peroxide-curable silicone compositions; curable polyolefin compositions such as polyethylene and polypropylene compositions; curable polyamide compositions; curable epoxy-resin compositions; curable amino-resin compositions; curable polyurethane compositions; curable polyimide compositions; curable polyester compositions; and curable acrylic resin compositions.

One or more selected regions of the first silicone film can be exposed to radiation having a wavelength of from about 150 nm to about 800 nm, alternatively from about 250 nm to about 450 nm, to produce a partially exposed film having at least one exposed region and at least one non-exposed region. Examples of the radiation used in such a case can include UV rays, electron beams, and ionizing radiation. UV rays can be advantageous from the standpoint of safety and equipment costs. The light source can be, for example, a high-pressure mercury lamp, medium-pressure mercury lamps. Xe—Hg lamps, or deep-UV lamps. The dose of radiation can be from about 0.1 mJ/cm$^2$ to about 10,000 mJ/cm$^2$, alternatively from about 100 mJ/cm$^2$ to about 8000 mJ/cm$^2$, or about 250 mJ/cm$^2$ to about 1,300 mJ/cm$^2$. The selected region of the first silicone film can be exposed to radiation through a photomask having a pattern of images. Depending on the type of the silicone composition used, it can sometimes be difficult or not possible to accomplish curing using the active energy rays alone. In such a case, after irradiation with active energy rays, curing can be finished by heating the film. In some examples, the temperature range for such heating can be about 50° C. to about 200° C.

The non-exposed region of the partially exposed first film can be removed with a developing solvent to form a patterned film. The developing solvent can include an organic solvent in which the non-exposed region of the partially exposed film is at least partially soluble and the exposed region is substantially insoluble. Depending on the specific silicone composition used to form the silicone core, the exposed region can be readily substantially insoluble in the developing solvent or can be subjected to an additional heating step, described below, to be rendered substantially insoluble in the developing solvent. The developing solvent can have from 3 to 20 carbon atoms per molecule. Examples of developing solvents include ketones, such as methyl isobutyl ketone and methyl pentyl ketone; ethers, such as n-butyl ether and polyethylene glycol monomethylether; esters, such as ethyl acetate and γ-butyrolactone; aliphatic hydrocarbons, such as nonane, decalin, and dodecane; and aromatic hydrocarbons, such as mesitylene, xylene, and toluene. The developing solvent can be applied by any conventional method, including spraying, immersion, and pooling. For example, the developing solvent can be applied by forming a pool of the solvent on a stationary substrate and then spin-drying the substrate. The developing solvent can be used at a temperature of from room temperature to 100° C. The specific temperature of use depends on, for example, the chemical properties of the solvent, the boiling point of the solvent, the desired rate of pattern formation, and the requisite resolution of the photopatterning process.

The patterned film then is heated for an amount of time sufficient to form at least one silicone core having a refractive index of from about 1.45 to about 1.60, alternatively from about 1.30 to about 1.70, alternatively from about 1.45 to about 1.55, at about 23° C. for light having a wavelength of approximately 589 nm, provided the refractive index of the at least one silicone core is greater than the refractive index of the substrate. The patterned film can be heated for an amount of time sufficient to achieve maximum crosslink density in the silicone without oxidation or decomposition. The patterned film can be heated at a temperature of from about 50° C. to about 300° C. for about 1 min to about 300 min. alternatively from about 75° C. to about 275° C. for about 10 min to about 120 min, alternatively from about 200° C. to about 250° C. for about 20 min to about 60 min. The patterned film can be heated using conventional equipment such as a hot plate or oven. In various examples, the silicone core can have a thickness (height) of from about 1 μm to about 100 μm, alternatively from about 5 μm to about 50 μm, alternatively from about 8 μm to about 20 μm.

An embodiment of an optical waveguide assembly prepared by a method of the present invention is shown in FIG. 1. The optical waveguide assembly includes a substrate 10 and a silicone core 20 including the silicone composition as described above and covering a portion of the substrate 10. The silicone core 20 has a refractive index of from about 1.45 to about 1.60 at 23° C. for light having a wavelength of 589 nm, and the silicone core 20 has a refractive index greater than the refractive index of the substrate 10.

The method for preparing an optical waveguide assembly can include the further optional steps of: covering the substrate and the silicone core with a second silicone composition to form a second film; and curing the second film to form a clad layer, wherein the clad layer has a refractive index less than the refractive index of the silicone core. The second composition can be a second curable polymer composition. In some embodiments, the second composition can be a second silicone composition. In some embodiments, the second composition can be an embodiment of the silicone composition of the present invention. In some embodiments, the optional steps are performed; in other embodiments, the optional steps are not performed.

The second composition can be, for example, any silicone composition that can cure in step (iv) to form a clad layer having a refractive index less than the refractive index of the silicone core. The cure mechanism of the second composition is not limited. The second composition can be cured, for example, by a condensation or addition reaction. Examples of the second composition include, but are not limited to, curable silicone compositions, such as hydrosilylation-curable silicone compositions, condensation-curable silicone compositions, and peroxide-curable silicone compositions; curable polyolefin compositions such as polyethylene and polypropylene compositions; curable polyamide compositions; curable epoxy-resin compositions; curable amino-resin compositions; curable polyurethane compositions; curable polyimide compositions; curable polyester compositions; and curable acrylic-resin compositions.

In one embodiment, the second composition can be the silicone composition of step (i), described above. In such an embodiment, at least one of $R^1$, $R^2$, $R^3$, $R^4$, $R^5$, $R^6$, a, b, c, and d can be chosen such that the organopolysiloxane resin cured to form the silicone core in step (i) has a chemical structure different from the chemical structure of the second silicone composition cured to form the clad layer.

The clad layer can have a refractive index less than the refractive index of the silicone core. The magnitude of the difference in refractive index between the silicone core and the clad layer depends on several factors, including the thickness of the core, wavelength of propagated light, and mode of wave propagation (i.e., single mode or multimode). The difference in refractive index between the silicone core and the clad layer can be from about 0.0005 to about 0.5, alternatively from about 0.001 to about 0.05, alternatively from about 0.005 to about 0.02. For example, a waveguide containing a silicone core having a thickness of 12 µm and a refractive index of 1.5, wherein the waveguide is capable of supporting the first four modes of propagation at a wavelength of 590 nm, can have a difference in refractive index between the silicone core and the substrate of about 0.01. A waveguide containing a silicone core having a thickness of 7 µm and a refractive index of 1.5, wherein the waveguide is capable of supporting only single mode propagation at a wavelength of 590 nm, can have a difference in refractive index between the silicone core and the clad layer of about 0.05. In various examples, the clad layer can have a thickness of from 5 µm to 200 µm, alternatively from 15 µm to 50 µm, alternatively from 20 µm to 35 µm.

Figure 2:
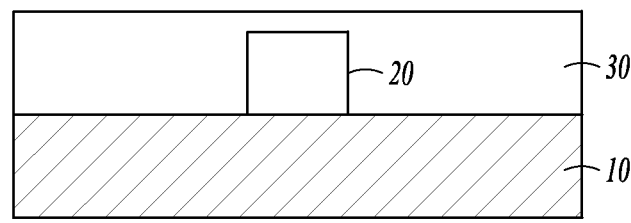
FIG. 2 illustrates a cross-sectional view of an embodiment of an optical waveguide assembly of the present invention, prepared according to methods described herein.

An embodiment of an optical waveguide assembly prepared by the first method, including the steps of formation and curing of a second composition to form a clad layer, is shown in FIG. 2. The optical waveguide assembly includes a substrate 10, a silicone core 20 including the silicone composition as described above and covering a portion of the substrate 10, and a clad layer 30 covering the silicone core 20 and a portion of the substrate 10 not covered by the silicone core 20. The silicone core 20 has a refractive index of from about 1.45 to about 1.60 at 23° C. for light having a wavelength of 589 nm, and the clad layer 30 has a refractive index less than the refractive index of the silicone core 20.

In further embodiments, the method of preparing a planar optical waveguide assembly, with or without an upper clad layer, can include an additional step between step (ii) and step (iii). In the additional step, the partially exposed film produced in step (ii) is heated. The heating can be conducted for an amount of time sufficient to render the region exposed to radiation ("exposed region") substantially insoluble in the developing solvent to be used in step (iii). But even after the additional heating step, the region of the partially exposed film that was not exposed to radiation in step (ii) ("non-exposed region") can be soluble in the developing solvent to be used in step (iii). The term "substantially insoluble" refers to the exposed region of the silicone film being not removed by dissolution in the developing solvent to the extent that the underlying surface of the substrate is exposed. The term "soluble" refers to the unexposed region of the silicone film being removed by dissolution in the developing solvent, exposing the underlying surface of the substrate. The partially exposed film can be heated at a temperature of from about 50° C. to about 250° C. for about 0.1 min to about 10 min, alternatively from about 100° C. to about 200° C. for about 1 min to about 5 min, alternatively from about 135° C. to about 165° C. for about 2 min to about 4 min. The partially exposed film can be heated using conventional equipment such as a hot plate or an oven. In example embodiments, optical waveguides such as those of the embodiments depicted in FIGS. 1 and 2 can be prepared by the method including the additional heating step.

A second method for preparing a flexible planar optical waveguide assembly includes: (i) applying a first composition to a surface of a substrate to form a first film; (ii) curing the first silicone film to form a lower clad layer; (iii) applying a second silicone composition to the lower clad layer to form a second film; (iv) exposing at least one selected region of the second film to radiation having a wavelength of from about 150 to about 800 nm to produce a partially exposed film having at least one exposed region and at least one non-exposed region; (v) removing the non-exposed region of the partially exposed film with a developing solvent to form a patterned film; and (vi) heating the patterned film for an amount of time sufficient to form at least one core having a refractive index of from about 1.45 to about 1.60 at about 23° C. for light having a wavelength of 589 nm; wherein the lower clad layer has a refractive index less than the refractive index of the silicone core; wherein at least one of the first silicone composition and the second silicone composition includes the composition of the present invention described in step (i) of the first method.

The first composition can be a first curable polymer composition. The second composition can be a second curable polymer composition. In another method for preparing a flexible planar optical waveguide assembly, the first composition is a first silicone composition, and the first film is correspondingly a first silicone film. In another embodiment, the second composition is a second silicone composition, and the second film is correspondingly a second silicone film, and the core is correspondingly a silicone core.

The first and second compositions, independent from each other, can be any polymer composition that cures in step (ii) to form a lower clad layer or in step (vi) to form a core, provided the lower clad layer has a refractive index less than the refractive index of the polymer core.

In an embodiment in which both the first and second composition include the silicone composition of the present invention, at least one of $R^1$, $R^2$, $R^3$, $R^4$, $R^5$, $R^6$, a, b, c, and d can be chosen such that the organopolysiloxane resin cured to form the lower clad layer in step (ii) has a chemical structure different from the chemical structure of the organopolysiloxane resin cured to form the core in step (vi).

The first film is cured in step (ii) to form a lower clad layer. The first polymer film can be cured by a variety of means, depending on the cure mechanism of the curable polymer composition, including exposure to ambient or elevated temperature, irradiation, and exposure to moisture. In various examples, the lower clad layer can have a thickness as described for the clad layer of waveguide assemblies produced according to the first method. The second composition can be applied to the lower clad layer in step (iii) using methods and having resulting cured-dimensions as described herein for waveguide assemblies produced according to the first method.

The core can have a refractive index greater than the refractive index of the lower clad layer. The magnitude of the difference in refractive index between the polymer core and the lower clad layer is as described above for the difference in refractive indices between the silicone core and the clad layer in waveguide assemblies produced according to the first method.

Figure 3:
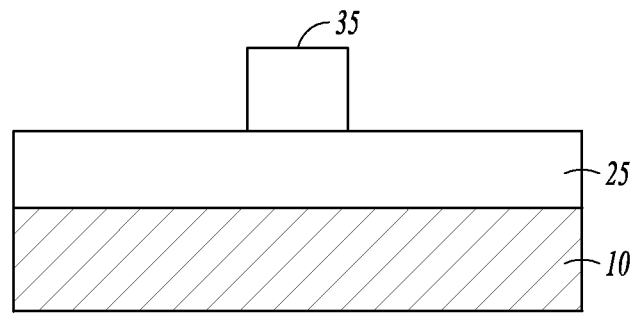
FIG. 3 illustrates a cross-sectional view of an embodiment of an optical waveguide assembly of the present invention, prepared according to methods described herein.

An embodiment of an optical waveguide assembly prepared by the second method is shown in FIG. 3. The optical waveguide assembly includes a substrate 10, a lower clad layer 25 including a first cured composition covering a surface of the substrate 10 and a core 35 including a second cured composition and covering a portion of the lower clad layer 25. At least one of the lower clad layer 25 and the polymer core 35 is derived from a curable polymer composition including the silicone composition described above. The core 35 has a refractive index of from about 1.45 to about 1.60 at 23° C. for light having a wavelength of 589 nm, and the lower clad layer 25 has a refractive index less than the refractive index of the core 35.

In some embodiments, the second method for preparing a planar optical waveguide assembly can include the further optional steps of: covering the lower clad layer and the polymer core with a third composition to form a third film; and curing the third film to form an upper clad layer, wherein the upper clad layer has a refractive index less than the refractive index of the core. In some embodiments, the optional steps are performed; in other embodiments, the optional steps are not performed. The third composition can be a third curable polymer composition. In some embodiments, the third composition is a third silicone composition, and correspondingly the third firm is a third silicone film. In some embodiments, the third composition can include the silicone composition described in step (i) of the first method of forming an optical waveguide assembly.

In optical waveguide assemblies including a lower clad layer, a core, and an upper clad layer, in one embodiment if the lower clad layer is derived from the silicone composition, the upper clad layer also is derived from the silicone composition. When both the first composition and the third composition include the silicone composition, groups $R^1$, $R^2$, $R^3$, $R^4$, $R^5$, $R^6$, a, b, c, and d can be the same or different in the first and third curable polymer compositions. In one embodiment, the first composition and the third curable polymer composition both include the silicone composition, but the second curable composition does not include the silicone composition. In another embodiment, only the second composition (cured to form the core) includes the silicone composition.

In another embodiment, all three compositions include the epoxy-functionalized silicone composition. In the organopolysiloxane resins making up the silicone composition, at least one of $R^1$, $R^2$, $R^3$, $R^4$, $R^5$, $R^6$, a, b, c, and d can be chosen such that the second silicone composition has a chemical structure different from the chemical structures of both the first silicone composition and the third silicone composition. Groups $R^1$, $R^2$, $R^3$, $R^4$, $R^5$, $R^6$, a, b, c, and d can be the same or different in the first and third silicone compositions, provided both the lower clad layer and the upper clad layer both have indices of refraction less than the index of refraction of the polymer core.

Figure 4:
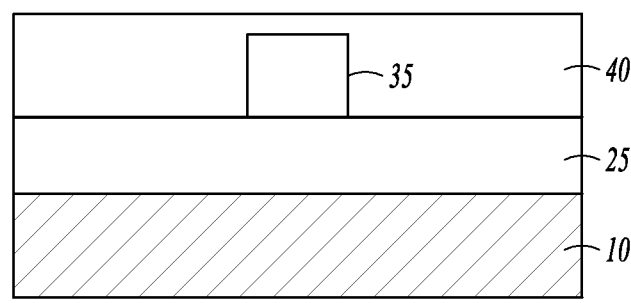
FIG. 4 illustrates a cross-sectional view of an embodiment of an optical waveguide assembly of the present invention, prepared according to methods described herein.

An embodiment of a planar optical waveguide assembly prepared by the second method, including steps of covering the lower clad layer and the polymer core with a third composition to form a third film; and curing the third polymer film to form an upper clad layer, wherein the upper clad layer has a refractive index less than the refractive index of the core is shown in FIG. 4. The optical waveguide assembly includes a substrate 10, a lower clad layer 25 including a cured first composition and covering a surface of the substrate 10, a polymer core 35 including a cured second composition and covering a portion of the lower clad layer 25, and an upper clad layer 40 including a cured third composition and covering the core 35 and a portion of the lower clad layer 25 not covered by the core 35. The polymer core 35 has a refractive index of from about 1.45 to about 1.60 at about 23° C. for light having a wavelength of about 589 nm. The lower clad layer 25 and the upper clad layer 40 each have a refractive index less than the refractive index of the core 35. The cured second composition (core 35) only, the cured first and third compositions (lower cladding layer 25 and upper cladding layer 40, respectively) only, or all three cured compositions (polymer core 35 and both cladding layers 25, 40), in their pre-cured state, can include the silicone composition described above.

As with the first method of preparing an optical waveguide assembly, the second method of preparing a planar optical waveguide assembly, with or without an upper clad layer, can include an additional step between step (iv) and step (v). In the additional step, the partially exposed film produced in step (iv) can be heated. The heating can be conducted for an amount of time sufficient to render the region exposed to radiation ("exposed region") substantially insoluble in the developing solvent to be used in step (v). But even after the additional heating step, the region that was not exposed to radiation in step (iv) ("non-exposed region") will be soluble in the developing solvent. The partially exposed film can be heated at a temperature of from about 50° C. to about 250° C. for about 0.1 min to about 10 min, alternatively from about 100° C. to about 200° C. for about 1 min to about 5 min, alternatively from about 135° C. to about 165° C. for about 2 min to about 4 min. The partially exposed film can be heated using conventional equipment such as a hot plate or an oven. In example embodiments, optical waveguides such as those of the embodiments depicted in FIGS. 3 and 4 can be prepared by the second method including this additional heating step.

An optical waveguide assembly can include a substrate having a first refractive index at about 23° C. for light having a wavelength of about 589 nm and at least one polymer core disposed over a portion of the substrate and including a second cured polymer composition, the at least one polymer core having a second refractive index from about 1.45 to about 1.60 at about 23° C. for light having a wavelength of about 589 nm, provided the second refractive index is greater than the first refractive index.

As described above, in some embodiments, the planar optical waveguide assembly can include a cladding. The cladding can include a lower clad layer, an upper clad layer, or both. The lower clad layer, if present, is disposed on the substrate and below the at least one polymer core and includes a cured first composition. Also, the lower clad layer has a third refractive index at about 23° C. for light having a wavelength of about 589 nm, the third refractive index being less than the second refractive index. The upper clad layer, if present, can be disposed on the polymer core. If both the lower clad layer and the upper clad layer are present, the upper clad layer can be disposed on both the polymer core and the lower clad layer. The upper clad layer includes a third cured polymer composition, and the upper clad layer has a fourth refractive index at 23° C. for light having a wavelength of 589 nm. The fourth refractive index is less than the second refractive index.

The methods described herein can be scalable to high-throughput manufacturing processes. The methods can allow simultaneous fabrication of multiple waveguides on a single substrate. Additionally, the methods employ conventional wafer fabrication techniques (e.g., coating, exposing, developing, curing) and equipment. Furthermore, the methods can use photo-patternable polymer and silicone compositions, thereby eliminating additional process steps (e.g., applying a photoresist and etching) associated with use of a non-photo-patternable polymer composition. Finally, the methods can have high resolution, meaning that the methods transfer images from a photomask to the silicone film on a substrate with good retention of critical dimensions. In various embodiments, the optical waveguide assemblies can be used to fabricate components of optical integrated circuits, such as attenuators, switches, splitters, routers, filters, and gratings.

EXAMPLES

The present invention is not limited to the examples given herein. The structure of the epoxy-functional organopolysiloxane resins used in the examples was determined by conducting $^{13}$C NMR and $^{29}$Si NMR measurements. The number-average molecular weight of the epoxy-functional organopolysiloxane resins was calculated using GPC based on comparison with polystyrene standards. The silanol and methoxy group content was measured via $^{29}$Si NMR. Film thickness was determined using the Tencor Alphastep 200. Additionally, Me, Ph, Vi, and $E^3$ in the average siloxane unit formulas below represent, respectively, methyl, phenyl, vinyl, and 2-(3,4-epoxycyclohexyl)ethyl groups.

Example 1

Preparation of Epoxy-Functional
Organopolysiloxane Resin (A1)

A solution of a silanol-containing methylphenylpolysiloxane resin was prepared by subjecting a mixture of phenyltrichlorosilane (505 g) and dimethyldichlorosilane (47 g) to co-hydrolysis and condensation in a mixture of toluene (50 g), 2-propanol (142 g), and water (142 g). The solution was neutralized with an aqueous solution of sodium hydrogencarbonate and washed with water, which was subsequently completely removed under heating. 2-(3,4-Epoxycyclohexyl)ethyltrimethoxysilane (226 g) and a 50 wt % aqueous solution of potassium hydroxide (2 g) were added to the remaining solution, and water, methanol and toluene were removed by azeotropic dehydration under heating and agitation. In the process, an appropriate amount of toluene was added to maintain the solid matter concentration at about 50 wt %. Upon termination of the dehydration condensation reaction of silanol groups, the solution was additionally refluxed for several hours to complete the equilibration reaction. After cooling down, a toluene solution (solid matter content: 499 g) of an epoxy containing organopolysiloxane resin with an average siloxane unit formula of $[Me_2SiO_{2/2}]_{0.10}[PhSiO_{3/2}]_{0.30}[E^3SiO_{3/2}]_{0.25}$ was obtained by neutralizing the reaction system with a solid acidic adsorbent and filtering off the adsorbent. The number-average molecular weight of the epoxy-functional organopolysiloxane resin was 2500, the phenyl group content was 59 mol %, and the total content of silanol and methoxy groups was 0.8 mol %.

Example 2

Preparation of Epoxy-Containing
Organopolysiloxane Resin (A2)

With the exception of using phenyltrichlorosilane (315 g), methyltrichlorosilane (191 g), dimethyldichlorosilane (55 g), and 2-(3,4-epoxycyclohexyl)ethyltrimethoxysilane (262 g) as the starting raw materials, a toluene solution (solid matter content: 490 g) of an epoxy-functional organopolysiloxane resin with an average unit formula of $[Me_2SiO_{2/2}]_{0.10}[MeSiO_{3/2}]_{0.30}[PhSiO_{3/2}]_{0.25}$ was obtained by conducting reactions in the same manner as in Example 1. The number-average molecular weight of the epoxy-functional organopolysiloxane resin was 3700, the phenyl group content was 32 mol %, and the total content of silanol and methoxy groups was 0.9 mol %.

Example 3

Preparation of Epoxy-Functional
Organopolysiloxane Resin (A3)

A toluene solution (490 g of solids) of an epoxy-functional organopolysiloxane resin represented by the following average unit formula: $[Me_2ViSiO_{1/2}]_{0.10}[Me_2SiO_{2/2}]_{0.05}[PhSiO_{3/2}]_{0.30}$ was prepared by means of the same reaction as in Example 1, with the exception that the starting material was composed phenyltrichlorosilane (423 g), dimethyldichlorosilane (23.5 g), trimethoxychlorosilane (39.5 g), and of 2-(3,4-epoxycyclohexyl)ethyltrimethoxysilane (269 g). In the obtained epoxy-functional organopolysiloxane resin, the number-average molecular weight was 1700, the content of the phenyl groups was 44 mole %, and the total content of the silanol groups and methoxy groups was 0.6 mole %.

Example 4

Preparation of Epoxy-Functional
Organopolysiloxane Resin (A4)

A toluene solution (499 g of solids) of an epoxy-functional organopolysiloxane resin represented by the following average unit formula: $[MeViSiO_{2/2}]_{0.10}[PhSiO_{3/2}]_{0.65}[E^3SiO_{3/2}]_{0.25}$ was prepared by means of the same reaction as in Example 1, with the exception that the starting material was composed of phenyltrichlorosilane (505 g), methylvinyldichlorosilane (52 g), and of 2-(3,4-epoxycyclohexyl)ethyltrimethoxysilane (226 g). In the obtained epoxy-functional organopolysiloxane resin, the number-average molecular weight was 2600, the content of the phenyl groups was 59 mole %, and the total content of the silanol groups and methoxy groups was 0.8 mole %.

Example 5

Preparation of Epoxy-Functional Organopolysiloxane Resin (A5)

A toluene solution (499 g of solids) of an epoxy-functional organopolysiloxane resin represented by the following average unit formula: $[Me_2SiO_{2/2}]_{0.15}[PhSiO_{3/2}]_{0.50}[E^3SiO_{3/2}]_{0.25}[SiO_{4/2}]_{0.10}$ was prepared by means of the same reaction as in Example 1, with the exception that the starting material was composed of phenyltrichlorosilane (424 g), of dimethyldichlorosilane (77 g), of tetramethoxysilane (61 g), and of 2-(3,4-epoxycyclohexyl)ethyltrimethoxysilane (246 g). In the obtained epoxy-functional organopolysiloxane resin, the number-average molecular weight was 3900, the content of the phenyl groups was 48 mole %, and the total content of the silanol groups and methoxy groups was 1.0 mole %.

In Examples 1-5, toluene can be removed under heat, reduced pressure, or both, before further processing of the resin.

Example 6

Formulations 1-4 were prepared that had the following compositions:

| Formulation | Resin solution, g (70 wt % solids) | Toluene, g | Diepoxy, g | UV9820, g |
|---|---|---|---|---|
| 1 (0%) | 34.35 | 25.65 | 0 | 1.20 |
| 2 (5%) | 32.66 | 24.37 | 1.35 | 1.18 |
| 3 (10%) | 34.38 | 25.65 | 3.00 | 1.26 |
| 4 (25%) | 30.56 | 22.80 | 8.02 | 1.24 |

The Resin solution is 30 wt % toluene, and 70 wt % resin having the average unit formula:

$$[Me_2ViSiO_{2/2}]_{0.1}[PhSiO_{3/2}]_{0.36}[E^3SiO_{3/2}]_{0.54}.$$

UV9820 is a photo-acid generator known to those of skill in the art that is an SbF$_6$-based iodonium photocatalyst. The Diepoxy was PC-1000.

Using each formulation, a film was prepared on a silicon wafer by spin coating using 500 RPM/200 (rpm/s) acceleration for 45 seconds. The film was then pre-baked 3 minutes at 110° C. The film was exposed to 1.2 J of ultra-violet light exposure on a QuintelQ-7000 Mask Aligner. The film was then heat cured for 3 minutes at 110° C. The film thickness was then measured by profilometer (Tencor Alphastep 500) to give the initial thickness. The wafer was then developed on a spin coater with a 60 second static wash with mesitylene, a 10 second rinse at 250 rpm with mesitylene and isopropyl alcohol, followed by a 30 second dry at 1500 rpm. The wafer was then baked for 30 minutes at 150° C., allowed to cool to room temp, and then a final thickness was measured.

| Formulation | Initial Thickness(μm) | final thickness (μm) |
|---|---|---|
| 1 | 7.4 | 5.9 |
| 2 | 7.5 | 7.3 |
| 3 | 7.8 | 7.6 |
| 4 | 8.7 | 8.7 |

The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those of ordinary skill in the art, and that such modifications and variations are considered to be within the scope of this invention as defined by the appended claims.

We claim:

1. A curable silicone composition, comprising:
(A) an epoxy-functional organopolysiloxane resin having the average unit formula $$(R^1R^2R^3SiO_{1/2})_a(R^4R^5SiO_{2/2})_b(R^6SiO_{3/2})_c(SiO_{4/2})_d \quad (I)$$

wherein $R^1$, $R^2$, $R^3$, $R^4$, $R^5$, and $R^6$ are organic groups independently selected from $C_{1-6}$ monovalent aliphatic hydrocarbon groups, $C_{6-10}$ monovalent aromatic hydrocarbon groups, and monovalent epoxy-substituted organic groups, $0 \leq a < 0.4$, $0 < b < 0.5$, $0 < c < 1$, $0 \leq d < 0.4$, $0.1 \leq b/c \leq 0.3$, $a+b+c+d=1$, the resin has a number-average molecular weight of at least about 2000, at least about 15 mol % of the organic groups are $C_6$ to $C_{10}$ monovalent aromatic hydrocarbon groups, and about 2 to about 50 mol % of siloxane units have epoxy-substituted organic groups;

(B) an epoxy-functional organosiloxane oligomer having an average of at least two epoxy-substituted organic groups per molecule and a molecular weight not greater than about 1500;

(C) a cationic photoinitiator; and (D) optionally, an organic solvent wherein the epoxy-functional organosiloxane oligomer has a formula selected from $$R^8R^7{}_2SiO(R^7{}_2SiO)_mSiR^7{}_2R^8 \quad (II),$$

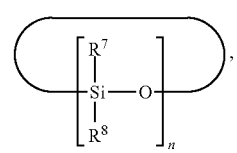

(III)

and $R^9Si(OSiR^7{}_2R^8)_3$ (IV), wherein $R^7$ is $C_{1-8}$ alkyl, $R^8$ is an epoxy-substituted organic group, $R^9$ is $R^7$ or $-OSiR^7{}_2R^8$, m is 0 or a positive integer, and n is from 3 to 10.

2. The curable silicone composition of claim 1, wherein the epoxy-functional organosiloxane oligomer has the formula:

$$R^8R^7{}_2SiO(R^7{}_2SiO)_mSiR^7{}_2R^8 \quad (II)$$

wherein m is 0 and $R^8$ is 3,4-epoxycyclohexylethyl.

3. The curable silicone composition of claim 1, further comprising a photosensitizer.

4. A cured composition obtained by curing the curable silicone composition of claim 1.

5. The cured composition of claim 4, wherein the cured composition is flexible.

6. The cured composition of claim 4, wherein the cured composition is a light-transmitting component of an optical waveguide.

7. An optical waveguide, comprising the cured composition of claim 4.

8. The cured composition of claim 4, wherein the curable silicone composition is cured using radiation.

9. The cured composition of claim 4, wherein the curable silicone composition is cured using UV light.

10. The cured composition of claim 4, wherein the curable silicone composition is cured using heat.

11. A method of preparing a flexible planar optical waveguide assembly, comprising the steps of:
(i) applying a first silicone composition to a surface of a substrate to form a first silicone film, the first silicone composition comprising
(A) an epoxy-functional organopolysiloxane resin having the average unit formula $$(R^1R^2R^3SiO_{1/2})_a(R^4R^5SiO_{2/2})_b(R^6SiO_{3/2})_c(SiO_{4/2})_d \qquad (I)$$

wherein $R^1$, $R^2$, $R^3$, $R^4$, $R^5$, and $R^6$ are organic groups independently selected from $C_{1-6}$ monovalent aliphatic hydrocarbon groups, $C_{6-10}$ monovalent aromatic hydrocarbon groups, and monovalent epoxy-substituted organic groups, $0 \leq a < 0.4$, $0 < b < 0.5$, $0 < c < 1$, $0 \leq d < 0.4$, $0.1 \leq b/c \leq 0.3$, $a+b+c+d=1$, the resin has a number-average molecular weight of at least about 2000, at least about 15 mol % of the organic groups are $C_6$ to $C_{10}$ monovalent aromatic hydrocarbon groups, and about 2 to about 50 mol % of siloxane units have epoxy-substituted organic groups,
(B) an epoxy-functional organosiloxane oligomer having an average of at least two epoxy-substituted organic groups per molecule and a molecular weight not greater than about 1500,
(C) a cationic photoinitiator, and
(D) optionally, an organic solvent; and
(ii) exposing at least one selected region of the first silicone film to radiation having a wavelength of from about 150 to about 800 nm to produce a partially exposed film having at least one exposed region and at least one non-exposed region;
(iii) removing the non-exposed region of the partially exposed film with a developing solvent to form a patterned film;
(iv) heating the patterned film for an amount of time sufficient to form at least one silicone core having a refractive index of from about 1.45 to about 1.60 at about 23° C. for light having a wavelength of about 589 nm; wherein the substrate has a refractive index less than the refractive index of the silicone core;
(v) optionally covering the substrate and the silicone core with a second silicone composition to form a second silicone film; and
(vi) optionally curing the second silicone film to form a clad layer, wherein the clad layer has a refractive index less than the refractive index of the silicone core.

12. The method of claim 11, further comprising, subsequent to exposing step (ii) and prior to removing step (iii):
(ii-2) heating the partially exposed film for an amount of time such that the exposed region is substantially insoluble in a developing solvent and the non-exposed region is soluble in the developing solvent.

13. The method of claim 11, wherein the second silicone composition comprises:
(A) an epoxy-functional organopolysiloxane resin having the average unit formula $$(R^1R^2R^3SiO_{1/2})_a(R^4R^5SiO_{2/2})_b(R^6SiO_{3/2})_c(SiO_{4/2})_d \qquad (I)$$

wherein $R^1$, $R^2$, $R^3$, $R^4$, $R^5$, and $R^6$ are organic groups independently selected from $C_{1-6}$ monovalent aliphatic hydrocarbon groups, $C_{6-10}$ monovalent aromatic hydrocarbon groups, and monovalent epoxy-substituted organic groups, $0 \leq a < 0.4$, $0 < b < 0.5$, $0 < c < 1$, $0 \leq d < 0.4$, $0.1 \leq b/c \leq 0.3$, $a+b+c+d=1$, the resin has a number-average molecular weight of at least about 2000, at least about 15 mol % of the organic groups are $C_6$ to $C_{10}$ monovalent aromatic hydrocarbon groups, and about 2 to about 50 mol % of siloxane units have epoxy-substituted organic groups;
(B) an epoxy-functional organosiloxane oligomer having an average of at least two epoxy-substituted organic groups per molecule and a molecular weight not greater than about 1500;
(C) a cationic photoinitiator; and
(D) an organic solvent.

14. The method of claim 11, wherein the optional steps of covering and curing are performed.

15. A flexible planar optical waveguide assembly prepared according to the method of claim 11.

16. The method of claim 11, further comprising (v) covering the substrate and the silicone core with a second silicone composition to form a second silicone film and (vi) curing the second silicone film to form a clad layer, wherein the clad layer has a refractive index less than the refractive index of the silicone core.

17. A method of preparing a flexible planar optical waveguide assembly, comprising the steps of:
(i) applying a first silicone composition to a surface of a substrate to form a first silicone film;
(ii) curing the first silicone film to form a lower clad layer;
(iii) applying a second silicone composition to the lower clad layer to form a second silicone film;
(iv) exposing at least one selected region of the second silicone film to radiation having a wavelength of from about 150 to about 800 nm to produce a partially exposed film having at least one exposed region and at least one non-exposed region;
(v) removing the non-exposed region of the partially exposed film with a developing solvent to form a patterned film;
(vi) heating the patterned film for an amount of time sufficient to form at least one silicone core having a refractive index of from about 1.45 to about 1.60 at about 23° C. for light having a wavelength of 589 nm; wherein the lower clad layer has a refractive index less than the refractive index of the silicone core;
(vii) optionally covering the lower clad layer and the silicone core with a third silicone composition to form a third silicone film; and
(viii) optionally curing the third silicone film to form an upper clad layer, wherein the upper clad layer has a refractive index less than the refractive index of the silicone core,
wherein at least one of the first silicone composition and the second silicone composition comprises, and the third silicon composition optionally comprises:
(A) an epoxy-functional organopolysiloxane resin having the average unit formula $$(R^1R^2R^3SiO_{1/2})_a(R^4R^5SiO_{2/2})_b(R^6SiO_{3/2})_c(SiO_{4/2})_d \qquad (I)$$

wherein $R^1$, $R^2$, $R^3$, $R^4$, $R^5$, and $R^6$ are organic groups independently selected from $C_{1-6}$ monovalent aliphatic hydrocarbon groups, $C_{6-10}$ monovalent aromatic hydrocarbon groups, and monovalent epoxy-substituted organic groups, $0 \leq a < 0.4$, $0 < b < 0.5$, $0 < c < 1$, $0 \leq d < 0.4$, $0.1 \leq b/c \leq 0.3$, $a+b+c+d=1$, the resin has a number-average molecular weight of at least about 2000, at least about 15 mol % of the organic groups are $C_6$ to $C_{10}$ monovalent aromatic hydrocarbon groups, and about 2 to about 50 mol % of siloxane units have epoxy-substituted organic groups,
(B) an epoxy-functional organosiloxane oligomer having an average of at least two epoxy-substituted organic groups per molecule and a molecular weight not greater than about 1500,
(C) a cationic photoinitiator, and
(D) optionally, an organic solvent.

18. The method of claim 17, further comprising, subsequent to exposing step (iv) and prior to removing step (v):
(iv-2) heating the partially exposed film for an amount of time such that the exposed region is substantially insoluble in a developing solvent and the non-exposed region is soluble in the developing solvent.

19. The method of claim 17, further comprising (vii) covering the lower clad layer and the silicone core with a third silicone composition to form a third silicone film and (viii) curing the third silicone film to form an upper clad layer, wherein the upper clad layer has a refractive index less than the refractive index of the silicone core.

* * * * *